United States Patent
Garcia et al.

(10) Patent No.: US 10,132,882 B2
(45) Date of Patent: Nov. 20, 2018

(54) SYSTEMS AND METHODS FOR MRI BODY COIL SUPPORT STRUCTURES

(71) Applicant: General Electric Company, Schenectady, NY (US)

(72) Inventors: Daniel Garcia, Pewaukee, WI (US); Wolfgang Daum, Sussex, WI (US); Chinmoy Goswami, Waukesha, WI (US); Jason Montclair Pittman, Waukesha, WI (US); Amy Meyers, Madison, WI (US)

(73) Assignee: General Electric Company, Schenectady, NY (US)

(*) Notice: Subject to any disclaimer, the term of this patent is extended or adjusted under 35 U.S.C. 154(b) by 685 days.

(21) Appl. No.: 14/734,149

(22) Filed: Jun. 9, 2015

(65) Prior Publication Data

US 2016/0363640 A1    Dec. 15, 2016

(51) Int. Cl.
*G01R 33/34* (2006.01)
*G01R 33/565* (2006.01)

(52) U.S. Cl.
CPC .. *G01R 33/34007* (2013.01); *G01R 33/34046* (2013.01); *G01R 33/5659* (2013.01)

(58) Field of Classification Search
CPC .. G01R 31/40; G01R 31/2841; G01R 31/001; G01R 31/2889; G01L 27/002
USPC ..................... 324/750.01, 500, 537
See application file for complete search history.

(56) References Cited

U.S. PATENT DOCUMENTS

| | | | |
|---|---|---|---|
| 5,489,848 A | 2/1996 | Furukawa | |
| 5,793,214 A * | 8/1998 | Wakamatsu | G01N 27/023 324/127 |
| 5,841,279 A | 11/1998 | Hayashi | |
| 6,437,568 B1 | 8/2002 | Edelstein | |
| 6,564,900 B1 | 5/2003 | Dean | |
| 7,141,974 B2 | 11/2006 | Edelstein et al. | |
| 7,242,176 B2 * | 7/2007 | Thomason | G01R 31/002 324/501 |
| 7,375,526 B2 | 5/2008 | Edelstein et al. | |
| 7,936,170 B2 | 5/2011 | Saha et al. | |
| 7,952,375 B2 * | 5/2011 | Eldridge | G01R 1/06711 324/754.03 |
| 8,884,620 B2 | 11/2014 | de Lima et al. | |
| 2007/0035297 A1 | 2/2007 | Kitagawa | |

(Continued)

*Primary Examiner* — Giovanni Astacio-Oquendo
(74) *Attorney, Agent, or Firm* — Dean D. Small; The Small Patent Law Group, LLC

(57) ABSTRACT

A body coil support structure includes an elongate support member. The elongate support member defines an opening and an examination axis passing through the opening along a length of the elongate support member. The opening is configured to accept an object to be imaged. The elongate support member has a target shape for use during operation of the MRI system, with the elongate support member configured to be subjected to an operational load during operation. In a design state, the elongate support member defines a design shape, with the elongate support member not subjected to the operational load in the design state. In an installed state after installation in the MRI system, the elongate support member defines an operational shape. The elongate support member is subjected to the operational load in the installed state. The operational shape is closer to the target shape than is the design shape.

20 Claims, 7 Drawing Sheets

(56) References Cited

U.S. PATENT DOCUMENTS

| | | |
|---|---|---|
| 2007/0290686 A1 | 12/2007 | Goldhaber |
| 2015/0002151 A1 | 1/2015 | Lazar et al. |
| 2015/0002154 A1 | 1/2015 | Lazar et al. |
| 2015/0362570 A1* | 12/2015 | Sakakura ............... A61B 5/055 324/319 |
| 2016/0025830 A1* | 1/2016 | Roland ................ A61B 5/4312 324/309 |
| 2016/0089029 A1* | 3/2016 | Biber .................... A61B 5/004 600/422 |

* cited by examiner

SYSTEMS AND METHODS FOR MRI BODY COIL SUPPORT STRUCTURES

BACKGROUND OF THE INVENTION

Embodiments of the present disclosure generally relate to support structures, for example body coil support structures for magnetic resonance imaging (MRI) systems.

MRI is a medical imaging modality that generates images of the inside of a human body without using x-rays or other ionizing radiation. MRI or Nuclear Magnetic Resonance (NMR) imaging generally provides for the spatial discrimination of resonant interactions between Radio Frequency (RF) waves and nuclei in a magnetic field. Typically, an MRI system includes a superconducting magnet that generates a main magnetic field within an imaging volume. The MRI system uses various types of radio frequency (RF) coils to create pulses of RF energy. The RF coils transmit RF excitation signals and receive magnetic resonance (MR) signals that the MRI system processes to form the images.

The B1 field in the RF coil may be circularly polarized so that from any direction the B1 field magnitude is constant. The uniformity of the distance between the RF shield and the RF coil has a significant impact on how circular the B1 field polarization is. Conventional wound fiber RF coils deform under the influence of gravity and become oblong (e.g., elliptically shaped, egg-shaped, or the like), which leads to elliptical or oblong polarization and B1+ shading in images. Processing techniques may be utilized to attempt to compensate for shading or other inaccuracies caused by non-circular polarization. Additionally, conventional RF coils may weigh around 100 pounds, leading to increased handling costs and installation costs.

BRIEF DESCRIPTION OF THE INVENTION

In one embodiment, a body coil support structure for a magnetic resonance imaging (MRI) system is provided that includes an elongate support member. The elongate support member defines an opening passing therethrough, and defines an examination axis passing through the opening along a length of the elongate support member. The opening is configured to accept an object to be imaged. The elongate support member has a target shape for use during operation of the MRI system, with the elongate support member configured to be subjected to an operational load during operation of the MRI system. In a design state prior to installation in the MRI system, the elongate support member defines a design shape, with the elongate support member not subjected to the operational load in the design state. In an installed state after installation in the MRI system, the elongate support member defines an operational shape. The elongate support member is subjected to the operational load in the installed state. The operational shape is closer to the target shape than is the design shape.

In another embodiment, a body coil support structure for a magnetic resonance imaging (MRI) system is provided that includes an elongate support member. The elongate support member defines an opening passing therethrough, and an examination axis passing through the opening along a length of the elongate support member. The opening is configured to accept an object to be imaged. The elongate member includes an outer skin, an inner skin, and interior members. The interior members define at least one fill pattern interposed between the inner skin and outer skin. The at least one fill pattern varies at least one of radially or axially.

In another embodiment, a method is provided. The method includes determining a target shape for an elongate support member of a body coil support structure. The method also includes determining at least one operational load to be applied to the elongate support member when utilized in a magnetic resonance imaging (MRI) system. Further, the method includes applying at least one opposite load to the target shape to obtain an opposite-loaded deformation shape for the elongate support member, with the at least one opposite load oriented in a direction opposite to the operational load. Also, the method includes forming the elongate support member in a design shape corresponding to the opposite-loaded deformation shape.

DETAILED DESCRIPTION OF THE INVENTION

Figure 1:
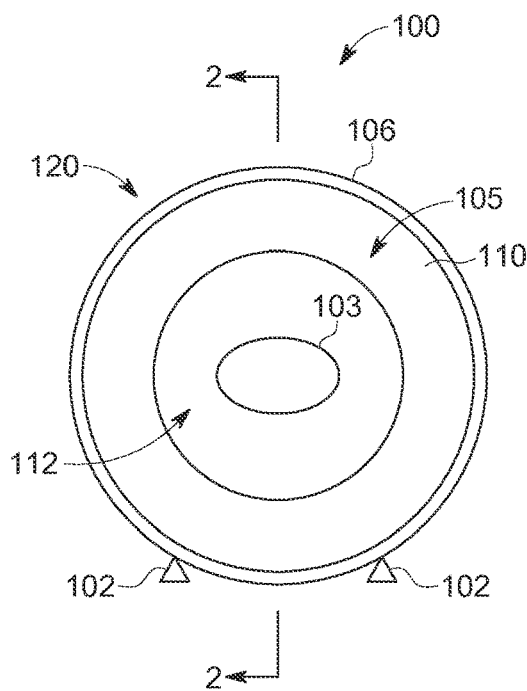
FIG. 1 illustrates a block schematic diagram of an MRI system including an elongate support structure formed in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. Various modules or units shown in the attached figures may represent the hardware that operates based on software or hardwired instructions, the software that directs hardware to perform the operations, or a combination thereof.

"Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and preceded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Various embodiments provide RF body coil assemblies with globally and/or locally variable parameters which may be used, for example, to reduce weight, reduce part count, and/or improve RF uniformity and polarization. In various embodiments, a wall thickness of a support structure for an RF body coil, a cross-sectional shape or area defined by the support structure, and/or a fill pattern of the support structure may be varied axially and/or radially to provide improved uniformity or homogeneity of cross-sectional shape (e.g., under the influence of gravitational and/or other loadings) and/or to reduce weight.

For example, known loads from point masses and/or body forces, as well as a desired final or target shape, may be used to predict a shape (e.g., design shape) that will deform into the target coil design when in use. Accordingly, a coil may be designed and/or manufactured with a design shape in the absence of an operational load, and deform into (or toward) the desired or target shape when subjected to the operational load, in contrast to conventional approaches where a structure deforms away from a desired shape when subjected to an operational load. In some embodiments, if a deformation of a coil and/or support structure is known to occur from a gravitational field or force (e.g., Earth's gravity), a pre-deformed starting geometry can be predicted by applying anti-gravity (or a gravitational force of equal magnitude but oriented in an opposite direction to the gravitational force to be experienced in operation) to a part or structure in a simulation, such as a finite element analysis (FEA) simulation. The resulting stressless deformed mesh may then be imported to follow up analysis applying the gravitational field or force to be experienced in operation, resulting in a shape that has deformed to or near the desired shape. For example, in some embodiments, a pre-deformed RF coil assembly may be 10 times closer to a desired shape (e.g., circular cross-section) than conventional designs.

Additionally or alternatively, various embodiments also provide for reduction of weight of body coil assemblies (e.g., by reducing the weight of a body coil support structure). In some embodiments, locally variable designs may allow for internal geometries that are not practical or possible to achieve using a lathe or a mill. For example, 3D printing may be used to form body coil support structures. In some embodiments, an outer and inner skin of a support structure may be connected by interior structures such as raster lines, spokes, or hexagons, among others. The interior structures may be projected between the space from the inner diameter (or inner skin) to the outer diameter (or outer skin), or from the outer diameter to the inner diameter. Interior structures may be used to provide fill patterns (patterns of structures between the inner and outer skins) that have voids, with the voids reducing the weight of the structure. Additionally, it may be noted that, because the magnet bore is a fixed size, with many subsystems and components (e.g., patient, cable track, lights, RF air, and/or patient air, among others) disposed within, bore space may be at a premium in MR scanners. The use of voids between interior members of one or more fill patterns may provide internal passages through which components may be integrated into the coil support structure, increasing the available bore space for the patient and/or other components such as electronics. The fill patterns may be varied axially and/or radially for a support structure to vary the size, location, and distribution of the voids to increase or maximize weight reduction while maintaining a desired strength or rigidity. For example, fill patterns with larger void areas or volumes may be utilized in areas where deflection is less critical and/or loading is generally lower (e.g., near axial ends of a support structure), while providing fill patterns with smaller void areas or volumes where deflection is more critical and/or loading is generally higher (e.g., toward the center or middle portion of support structures where body coils are mounted).

Various embodiments provide RF body coil support structures that have improved similarity to target or desired shapes when subject to operational loads, and/or reduction of weight for RF body coil support structures. A technical effect of at least one embodiment includes improving improved performance of MRI systems, for example due to improved RF uniformity and polarization (e.g., due to improved uniformity of shape of a body coil assembly). A technical effect of at least one embodiment includes reduced reliance on B-field shading compensation techniques such as dual drive and parallel transmit by improving B1 field polarization and uniformity. A technical effect of at least one embodiment includes improved image quality. A technical effect of at least one embodiment includes minimization of the impact of RF shield variation from system to system, for example due to improved consistency of concentricity of a body coil assembly along an axial length. A technical effect of at least one embodiment includes reduced weight and/or cost. While various embodiments discussed herein are discussed in connection with use with body coils of MRI system, it may be noted that additional embodiments may be used in connection with other aspects of MRI systems or other systems.

Figure 2:
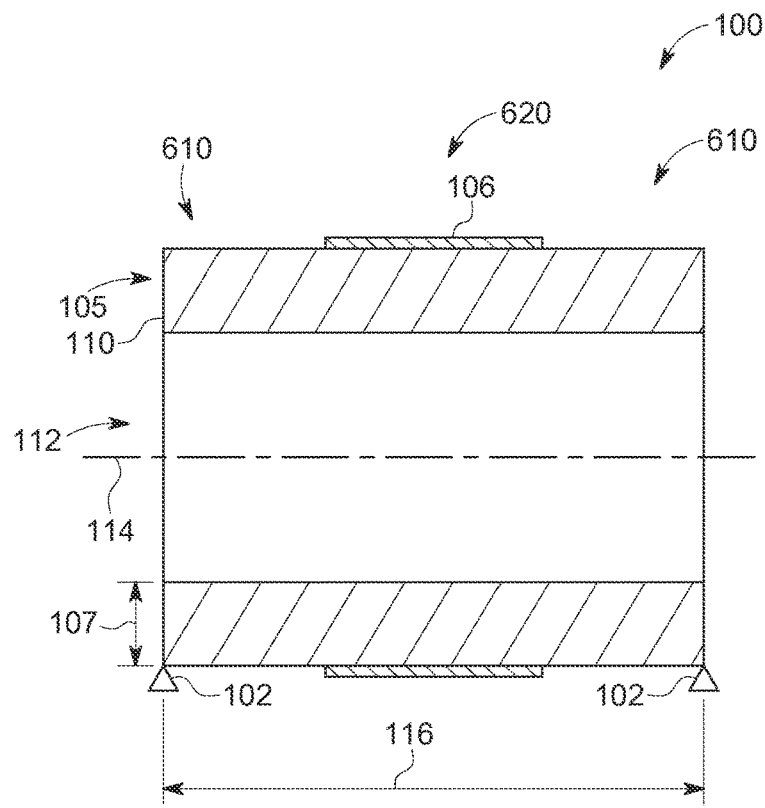
FIG. 2 illustrates a side sectional view of the MRI system of FIG. 1.

FIG. 1 illustrates a block schematic diagram of an end view of an MRI system 100 formed in accordance with various embodiments, and FIG. 2 illustrates a longitudinal section taken along line 2-2 of FIG. 1. It may be noted that numerous aspects of the MRI system 100 (e.g., superconducting magnet and related components, gradient coil and related components, and the like) have been omitted for clarity of illustration of aspects regarding RF body coil assemblies in FIG. 1. As seen in FIGS. 1 and 2, the MRI system 100 includes a body coil support structure 105 and a body coil 106 (e.g., an RF body coil). The body coil 106, for example, may be configured as a birdcage coil. Generally, the body coil support structure 105 is configured to accept an object 103 (e.g., a human patient or portion thereof) for MR imaging, and to support the body coil 106 and/or maintain the body coil 106 in a desired position with respect to the object 103 and/or other components of the MRI system (e.g., RF shield, gradient coil). In the illustrated embodiment, the MRI system 100 includes base supports 102 configured to support the body coil support structure 105.

The body coil support structure 105 includes an elongate support member 110. In the illustrated embodiment, the elongate support member 110 is formed as a cylindrical tube having a wall thickness 107. The elongate support member 110 includes an opening 112, and extends along an examination axis 114. The opening 112 is configured to accept the object 103 to be imaged, such as a human patient, and may have an internal diameter of 60 centimeters as one example, or, as another example, an internal diameter of 70 centimeters. The elongate support member 110 also has a length 116, as seen in FIG. 2. The elongate support member 110 in various embodiments may be made using a strong, lightweight, non-electrically conductive, flame resistant material. In some embodiments, the elongate support member 110 may be 3-D printed, for example using a material such as Ultem.

Figure 3:
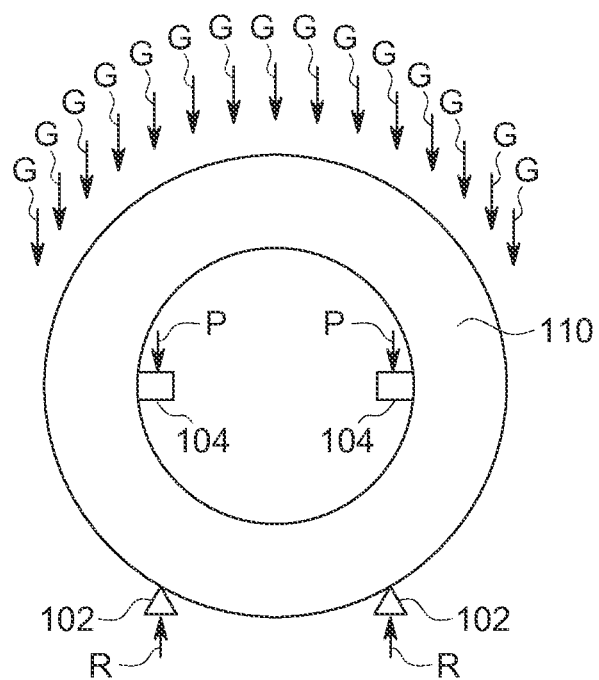
FIG. 3 depicts example operational loads of the MRI system of FIG. 1 accordance with various embodiments.

The elongate support member 110 has or corresponds to a target shape 120 (as seen in FIG. 1) for use during operation of the MRI system 100. In the illustrated embodiment, the target shape is a circle. When in use, the elongate support member 110 is subject to operational loading. FIG. 3 depicts example operational loads of the MRI system 100 in accordance with various embodiments.

For instance, as seen in FIG. 3, the elongate support member 110 is subject to a distributed gravitational force indicated by G's caused by the Earth's gravitational field. The examination axis 114 of the depicted embodiment (which extends out of the page for the embodiment depicted in FIG. 3) extends perpendicularly to Earth's gravitational field. As seen in FIG. 1, the elongate support member 110 includes rails 104 configured to support a table or bed for the object 103, and thus the elongate support member 110 is subject to forces P resulting from the patient weight (along with the weight of the table). Reaction forces R are shown acting through the base supports 102.

Figure 4:
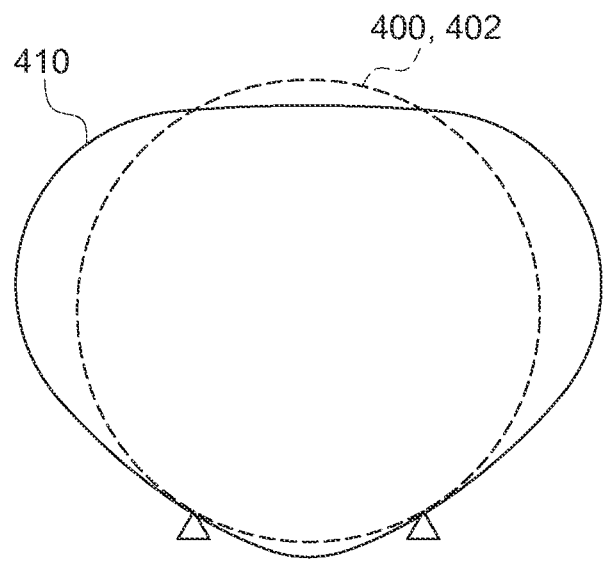
FIG. 4 illustrates an example of deformation away from a desired shape.

Because the elongate support member 110 is subject to operational forces, the elongate support member 110 when in operation will deflect or deform from an initial or design state not subject to operational forces. For example, if the elongate support member 110 were designed as a perfect or ideal circle when not subject to the operational loads, when in operation and subjected to the operational loads, the elongate support member 110 would deviate away from the desired shape. Such deviation may cause increased non-uniformity and/or non-circular polarization of a field generated by the body coil 106 supported by the body coil support structure 105, and/or require increased clearances between a gradient coil and the body coil 106. For example, FIG. 4 illustrates an example of deformation away from a desired shape 400. In the example of FIG. 4, the desired shape 400 and the design shape 402 are the same, namely a circle in the example of FIG. 4. However, because gravity is acting downward upon the cross-section generally, and reaction forces are acting upward on a bottom portion of the cross-section, a deformation shape 410 results, wherein an upper portion of the cross-section is compressed downward, and the cross-section also deforms outward laterally.

Figure 5:
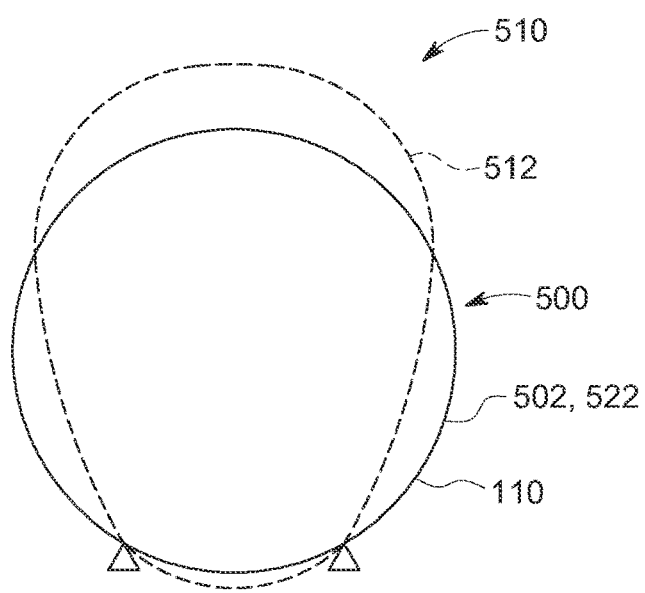
FIG. 5 illustrates an end view of an elongate support member formed in accordance with various embodiments.

Accordingly, to help provide improved uniformity and/or consistency of performance, in various embodiments, the elongate support member 110 may have a design shape that differs from the desired shape, and is configured to deform to the desired shape under the influence of known or expected operational loads. For example, as depicted in FIG. 5, the elongate support member 110 has both a design state 510 and an installed state 500. The installed state 500, for example, may correspond to a positioning of the examination axis 114 perpendicular or normal to the Earth's gravitational field and/or subject to other operational loads. The design state 510 may correspond to a different orientation (e.g., the examination axis oriented parallel to the Earth's gravitational field during a 3-D printing process). Further, the design state 510 may correspond to a set of inputs used in a manufacturing process.

When in the design state (e.g., prior to installation in the MM system 100, and not subjected to operational loads), the elongate support member 110 defines a design shape 512. As seen in FIG. 5, the design shape 512 differs from the desired shape 522 (a perfect circle in the illustrated embodiment). The design shape 512 is selected or configured such that, when in the installed state (e.g., perpendicular to Earth's gravity and/or subject to other known or expected operational loads), the elongate support member 110 deforms under the loads to define an operational shape 502. In the depicted embodiment, the design shape 512 is oblong, and the target or desired shape 522 is circular. As seen in FIG. 5, the operational shape 502 and the desired shape 522 are depicted as identical. It may be noted that in practice, the operational shape 502 and the desired shape 522 may not be identical; however, the operational shape 502 is more similar to or closer to the desired shape 522 than is the design shape 512. For example, one or more dimensions or measure (such as height, width, cross-sectional width, average diameter, concentricity, or uniformity) of the operational shape 502 may be closer in value to the corresponding value for the design shape 522 than are the values of the design shape 512.

Figure 6:
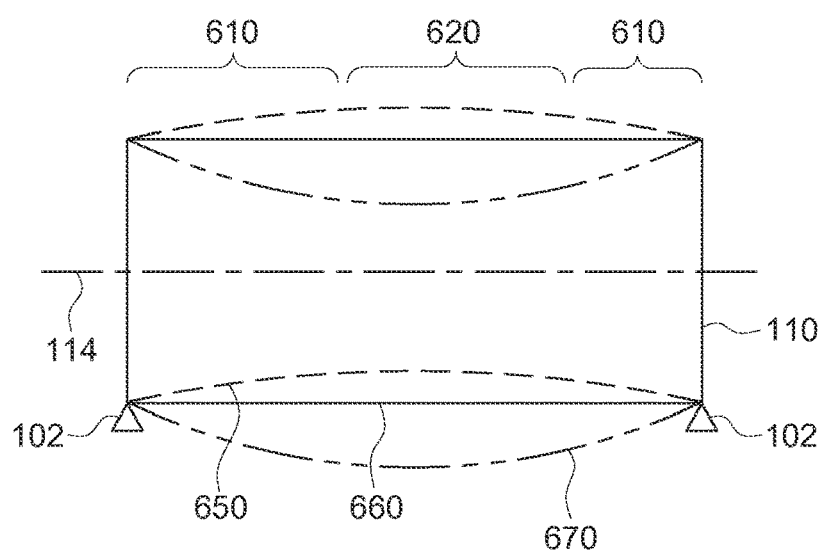
FIG. 6 depicts a side view of an elongate support member in accordance with various embodiments.

It may be noted that the operational shape 502 may vary along the length 116 or along the examination axis 114. For example, FIG. 6 depicts a side view of the elongate support member 110 in accordance with various embodiments. In FIG. 6, the elongate support member 110 is supported by base supports 102 at each end. The elongate support member 110 may be understood as having end regions 610 and a central region 620. Because the central region 620 is farthest from the base supports 102, the central region may be subject to increased moments and increased deflection. Further, because the body coil 106 may be positioned at the central region 620, the uniformity or consistency of shape may be more important for the central region 620 than for the end regions 610 for providing a uniform field. Accordingly, a shape, wall thickness, fill pattern, and/or other design parameter for the central region 620 may be varied from a corresponding design parameter for the end regions 610 to provide improved strength or rigidity for the central region 620, or to otherwise account for different loadings and/or deflections of the central region 620 and the end regions 610.

As seen in FIG. 6, the elongate support member defines two shapes—a design shape 650 (shown in dashed lines) and an installed shape 660 (shown in solid lines), with the installed shape 660 being the same as the desired or target shape in the illustrated embodiment. A deflected shape 670

(shown in phantom lines) indicates the shape that would result under operational loads if the target shape were used as the design shape.

As seen in FIG. 6, the design shape 650 is bowed upward or deviates upwardly from the desired shape or installed shape 660, with a maximum deviation at a midpoint between the base supports 102. Thus, the cross-section of the elongate support member 110 varies along the length 116 (e.g., the center point of the cross-section is higher with respect to the examination axis 114 toward the central portion 620). Further, the wall thickness and/or fill pattern may also vary along the length (and/or radially).

Figure 7:
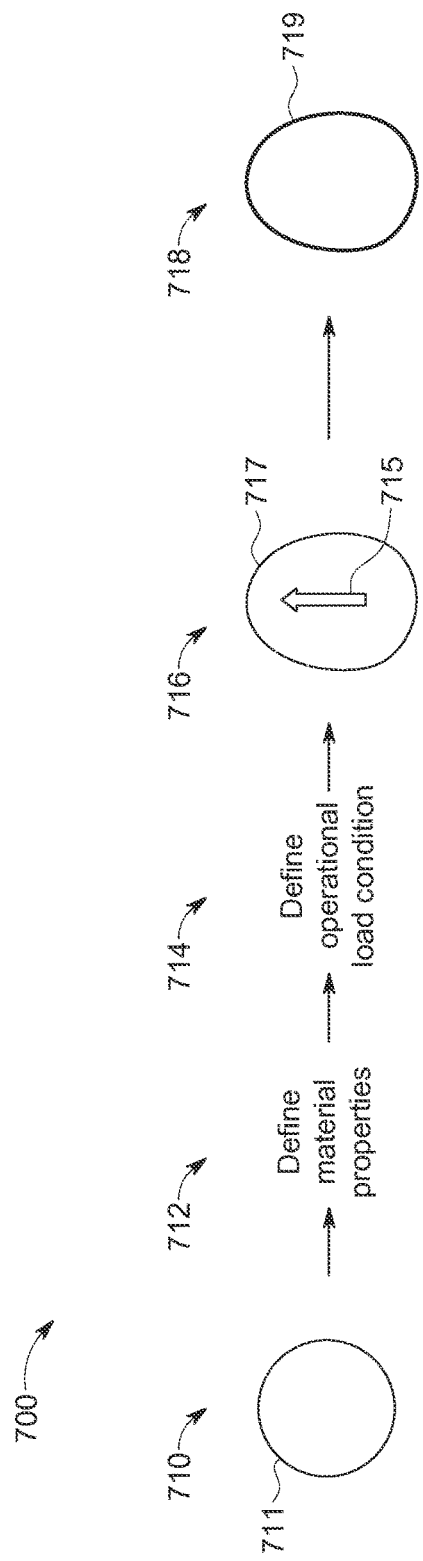
FIG. 7 depicts an example process flow in accordance with various embodiments.

In various embodiments, the design shape may be selected using a computational technique such as finite element analysis (FEA). FIG. 7 depicts an example process flow 700 for selecting a design shape using FEA. At 710, a target shape mesh 711 is defined corresponding to the target shape. For example, a circular cross-section that is uniform along the length of a support structure may be defined. At 712, material properties of the target shape mesh 711 are defined. The material properties are defined based on the material to be used. Next, at 714, an operational load condition is defined. The operational load may include gravitational forces and/or additional loads (such as a patient and table weight for embodiments in which the support structure will also support the patient). Also, at 714, constraints such as locations of support points (e.g., from base supports 102) may be defined as part of the operational load condition. At 716, the target shape is deformed to obtain an opposite-loaded mesh. For example, the target shape may be constrained at one or more support points specified at 714, and using a simulated force (or forces) 715 that is equal in magnitude but opposite in direction to the operational load defined at 714. For example, if the support structure is to be subjected to a first gravitational field in the operating state, the simulated force may correspond to a loading caused by a second gravitational field oriented oppositely to the first gravitational field. For example, the simulated force 715 is oriented upward in the depicted embodiment, whereas in the installation state or operational state a downward gravitational force is to be experienced. The application of the simulated force (e.g., a load oriented opposite the operational load) results in an opposite-loaded deformation shape 717 for the elongated support member. It may be noted again that the opposite-loaded deformation shape 717 may vary along the examination axis (e.g., have a greater deflection at a central region located away from end supports). At 718, the opposite-loaded deformation shape is utilized to determine the design shape 719. For example, the design shape 719 may be the same as the opposite-loaded deformation shape 717. Accordingly, the design state may be understood as corresponding to a loading of the elongate support member oriented oppositely to the operational load. In some embodiments, the design shape may vary from the opposite-loaded deformation shape, for example to include one or more bosses configured for mounting with a base support or other component. In some embodiments, after the design shape is determined, a confirmatory FEA analysis may be performed by applying a simulated operational load to the design shape to confirm the resulting shape conforms to the desired or target shape.

Figure 8:
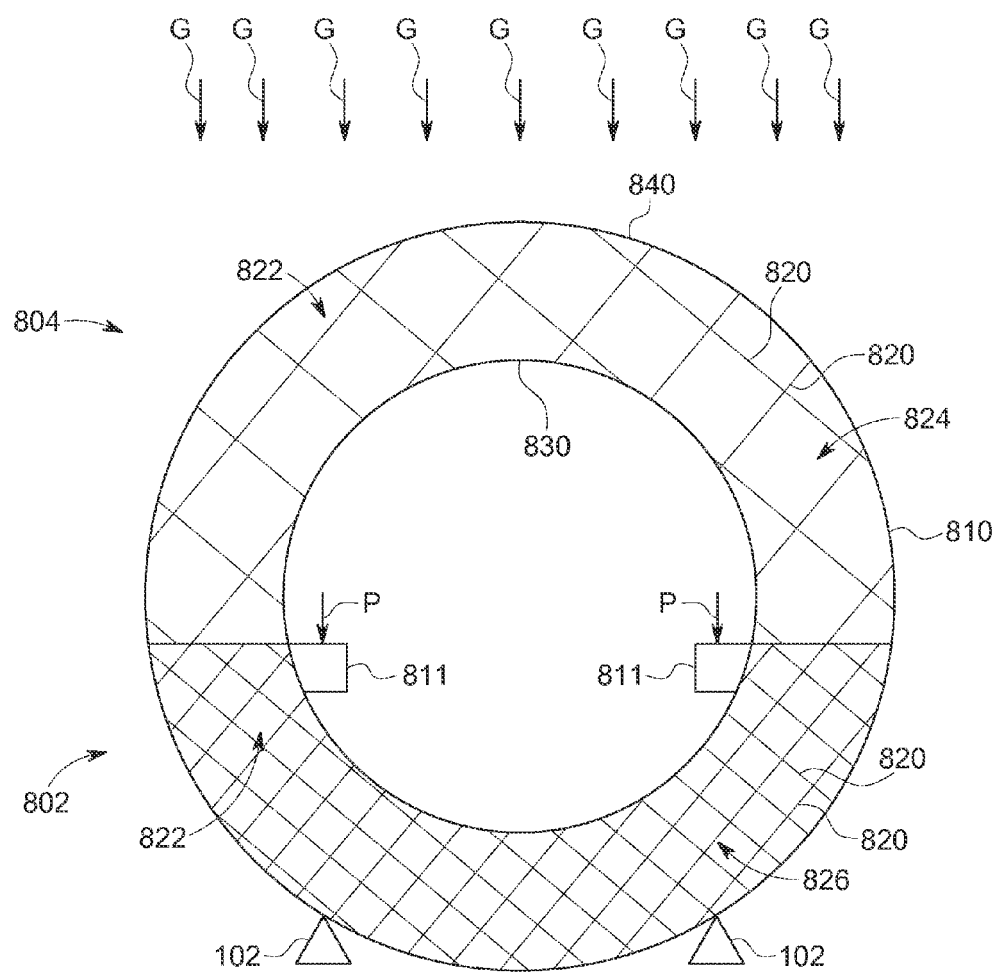
FIG. 8 illustrates an example cross-sectional view of an elongate support member formed in accordance with various embodiments.

As indicated herein, the elongate support member 110 may include an outer skin, an inner skin, and interior members defining at least one fill pattern interposed between the inner skin and outer skin. FIG. 8 illustrates an example cross-sectional view of an elongate support member 810 formed in accordance with various embodiments. The elongate support member 810 of the illustrated embodiment is generally circular in cross-section and defines a cylindrical tube. The elongate support member 810 includes rails 811 configured to accept a patient loading P. The elongate support member 810 is also configured to experience a gravitational loading G. The elongate support member 810 also includes interior members 820 extending between an inner skin 830 and an outer skin 840. Voids 822 are defined between the interior members 820. As seen in FIG. 8, a first fill pattern 824 is defined for an upper portion 804 and a second fill pattern 826 is defined for a bottom portion 802. The first fill pattern 824 has a larger area or volume occupied by voids 822 than the second fill pattern 826. The second fill pattern 826 has more densely packed interior members 820 than the first fill pattern 824. It may be noted that one or more voids 822 may be utilized as internal passages through which components (e.g., cables, wires, air conduits) may be integrated into the coil support structure, increasing the available bore space for the patient and/or other components such as electronics.

With base supports 102 positioned toward the bottom portion 802, the resulting stresses and strains on the elongate support member 810 are greater for the bottom portion 802 than for a top portion 804. Accordingly, the fill patterns defined by the interior members 820 and voids 822 may be more dense or rigid for a second fill pattern 826 used for the bottom portion 802 than for a first fill pattern 824 used for the upper portion 804. Accordingly, weight may be reduced but sufficient strength or rigidity achieved by efficiently distributing interior members to locations of greater benefit. Alternatively or additionally, the type of fill pattern (e.g., shape of arrangement of fill pattern, such as solid fill, or spokes, among others) may be varied.

Again, the loading may vary along the length of the elongate support member. Accordingly, the type, number, and/or density of fill patterns employed for cross-sections located along the length of the elongate support member may vary. For example, with reference to FIG. 6, one or more fill patterns utilized for the central portion 620 may be more dense or otherwise more rigid (e.g., the inner and/or outer skin may have increased thicknesses) than one or more fill patterns utilized for the end portions 610. Accordingly, at least one fill pattern of an elongate support member may can vary radially (e.g., vary from an upper portion to a bottom portion) and/or axially (e.g., vary along a length). Fill patterns may be formed in various embodiments using 3-D printing. The particular size, shape, orientation, arrangement, or other configuration of the interior members of one or more fill patterns utilized in an elongate support member or RF body coil support may be selected to provide a desired amount of rigidity while reducing weight.

Figure 9:
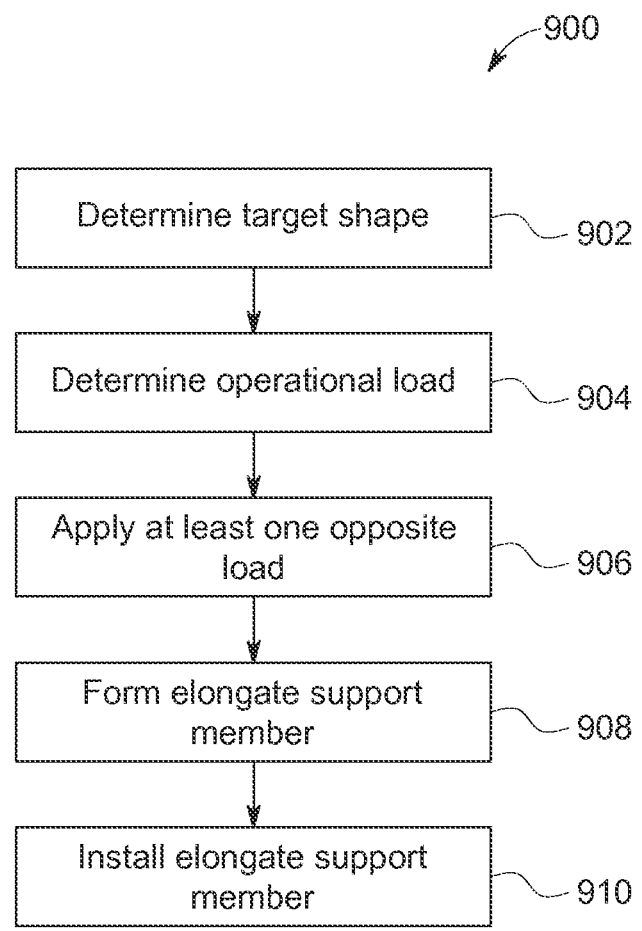
FIG. 9 is a flowchart of a method in accordance with various embodiments.

FIG. 9 provides a flowchart of a method 900 for providing a support member (e.g., a support member for use with an MRI RF body coil). The method 900, for example, may employ or be performed by structures or aspects of various embodiments (e.g., systems and/or methods and/or process flows) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 902, a target shape is determined for an elongate support member of a body coil support structure or assembly. For example, a uniform circular cross-section extending along a length of a cylindrical body coil support structure may be selected. The particular dimensions of the circle and cylinder may be selected so that the cylinder may accept a human patient for MRI imaging, and so that a body coil may be affixed, embedded, or otherwise joined to an exterior of the body coil support structure.

At 904, at least one operational load to be applied to the elongate support member when the elongate support member is utilized in an MRI system is determined. For example, the elongate support member may define an operational or examination axis passing along the length of the cylindrical body that is oriented perpendicularly to a gravitational field (e.g., Earth's gravity) when the elongate support member is utilized in the MRI system. The operational load accordingly may include a gravitational load caused by the gravitational field. Alternatively or additionally, the operational load may include loads corresponding to masses supported at or by one or more parts of the elongate support member, such as a patient and/or table or bed. In various embodiments, defining the operational load may also include identifying support points and/or reaction forces to the gravitational load (and/or other loads).

At 906, at least one opposite load is applied to the target shape. In some embodiments, the opposite load may be applied in a computational sense instead of a physical sense, for example via a simulation performed using FEA. (See, e.g., FIG. 7 and related discussion.) In embodiments where the operational load is a gravitational load, the opposite load may be modeled as a gravitational field of similar magnitude but opposite direction to the gravitational load to be experienced in operation. Application of the opposite load in the depicted embodiment provides an opposite-loaded deformation shape.

At 908, the elongate support member is formed in a design shape corresponding to the opposite-loaded deformation shape. For example, inputs corresponding to the opposite-loaded deformation shape may be provided to a 3D printer that utilizes the inputs to produce the elongate support member. In some embodiments, the elongate support member may include an outer skin and an inner skin. Forming the elongate support member may include forming interior members (e.g., via 3D printing) that define at least one fill pattern interposed between the inner skin and the outer skin. It may be noted that forming the interior member may include varying the at least one fill pattern axially and/or varying the at least one fill pattern radially. By varying the fill patterns, different rigidities (and densities or weights) may be efficiently distributed based on the location of most impact of the loads, while reducing weight. For example, in some embodiments, a first fill pattern may be formed that is disposed proximal at least one end portion of the elongate support member. A second fill pattern may be formed that is disposed proximal a central portion along the length of the axial support member, with the first fill pattern being less rigid (or dense) than the second fill pattern. Accordingly, where a deflection is greater (e.g., at a central portion away from end supports) and/or where uniformity is more important (e.g., at a central portion where a RF body coil is mounted to the elongate support member) a more rigid fill pattern may be used, while a less rigid (and lower weight) fill pattern may be used where deflection is less or where RF body coils are not mounted (e.g., one or more end portions). As another example, the elongate support member may include a lower portion and an upper portion, with the lower portion configured to support an external load. Forming the interior members may then include forming a first fill pattern disposed in the upper portion and a second fill pattern disposed in the lower portion, with the first fill pattern is less rigid than the second fill pattern. Thus, the lower portion, which will be more impacted by the external load, may have a denser, more rigid fill pattern, while the upper portion, which will be less impacted by the external load, may have a less dense, lower weight fill pattern.

At 910, the elongate support member is installed in the MRI system, and subjected to the operational load. For example, the elongate support member may have been 3D printed, with an operational or examination axis oriented parallel to a gravitational field, with a design shape that differs from a target shape. Then, the elongate support member may be installed in the MRI system, and subjected to a gravitational field perpendicular to the operational or examination axis, causing the elongate support member to deflect or deform from the design shape to an operational shape that is more similar to the target shape.

Accordingly, various embodiments provide for improved uniformity, accuracy, consistency, and/or reliability of a shape of a RF body coil support, resulting in more uniform fields and improved imaging (and/or reduce computational requirements for addressing inhomogeneities of fields). Additionally or alternatively, various embodiments provide for reduced weight of body coil supports while maintaining desired strength or rigidity.

Figure 10:
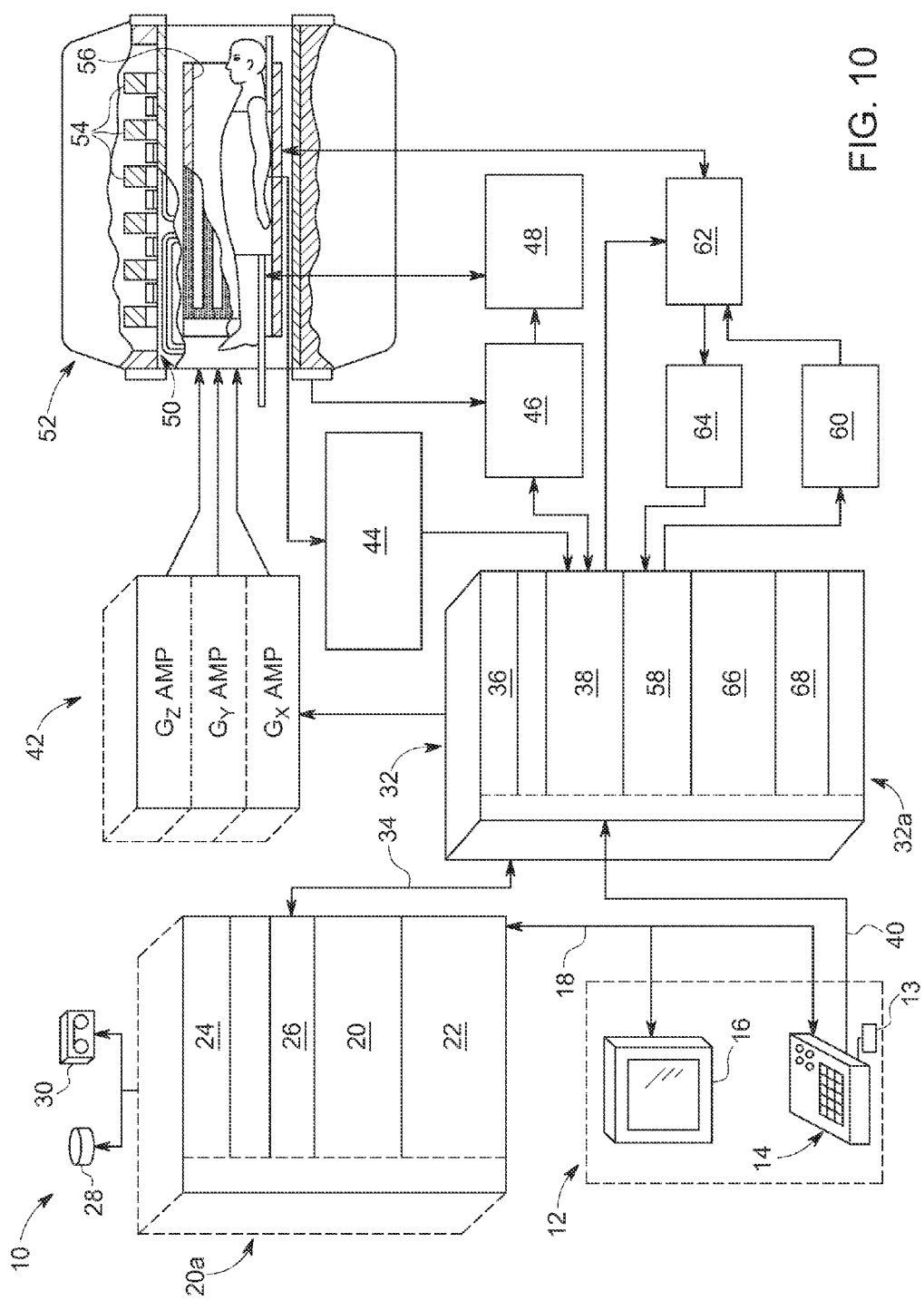
FIG. 10 illustrates a block schematic diagram of an MR system formed in accordance with various embodiments.

Various methods and/or systems (and/or aspects thereof) described herein may be implemented using a medical imaging system. For example, FIG. 10 depicts various major components of a MRI system 10 formed in accordance with various embodiments. The operation of the system is controlled from an operator console 12 which includes a keyboard or other input device 13, a control panel 14, and a display 16. The console 12 communicated through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light want, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the san sequence that is to be performed. The pulse generator module 38 operates the system components to carry out the desired scan sequence and produce data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensor connected to the patient or subject, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan. In the embodiment depicted in FIG. 10, the operator console 12 may be located outside of the scan room. It may be noted that, in various embodiments, all or a portion of the control electronics or components may be located within the scan room. Thus, for example, all or a portion of the scan room interface 46 and/or backplane 32a may be eliminated and/or incorporated into other control electronics disposed within the scan room.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 and RF shield (not shown) form a part of a magnet assembly 52 which includes a polarizing magnet 54 and a RF coil assembly 56. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 or apportion thereof and coupled through transmit/receive switch 62 to a preamplifier 64. The amplified MR signals are demodulated, filtered, and digitized in the receive section of the transceiver 58. The transmit/receive switch 62 is controlled by a signal from the pulse generator module 38 to electrically connect the RF amplifier 60 to the coil assembly 56 during the transmit mode and to connect the preamplifier 64 to the coil assembly 56 during the receive mode. The transmit/receive switch 62 can also enable a separate RF coil (for example, a surface coil) to be used in either the transmit or receive mode.

The MR signals picked up by the selected RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which may operate to Fourier transform the data into an array of image data. It may be noted that time variant and dependent Taylor series may be employed in various embodiments. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid-state drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A body coil support structure for a magnetic resonance imaging (MRI) system, the body coil support structure comprising:
   an elongate support member defining an opening passing therethrough, the elongate support member defining an examination axis passing through the opening along a length of the elongate support member, the opening configured to accept an object to be imaged, wherein the elongate support member has a target shape for use during operation of the MRI system, wherein the elongate support member is configured to be subjected to an operational load during operation of the MRI system;
   wherein, in a design state prior to installation in the MRI system, the elongate support member defines a design shape, wherein the elongate support member is not subjected to the operational load in the design state; and
   wherein, in an installed state after installation in the MRI system, the elongate support member defines an operational shape, wherein the elongate support member is subjected to the operational load in the installed state, wherein the operational shape is closer to the target shape than is the design shape.

2. The body coil support structure of claim 1, wherein the design state corresponds to at least one loading of the elongate support member oriented oppositely to the operational load.

3. The body coil support structure of claim 1, wherein the examination axis is oriented perpendicularly to a first gravitational field in the installed state.

4. The body coil support structure of claim 3, wherein the design state corresponds to loading by a second gravitational field oriented oppositely to the first gravitational field.

5. The body coil support structure of claim 1, wherein the target shape comprises a circular cross-section, and wherein the design shape has an oblong cross-section.

6. The body coil support structure of claim 1, wherein the design shape varies along the length of the elongate support member.

7. The body coil support structure of claim 1, wherein the elongate support member comprises an outer skin, an inner skin, and interior members defining at least one fill pattern interposed between the inner skin and outer skin.

8. The body coil support structure of claim 7, wherein the at least one fill pattern varies at least one of radially or axially.

9. A body coil support structure for a magnetic resonance imaging (MRI) system, the body coil support structure comprising:
   an elongate support member defining an opening passing therethrough, the elongate support member defining an examination axis passing through the opening along a length of the elongate support member, the opening configured to accept an object to be imaged, wherein the elongate support member comprises
   an outer skin,
   an inner skin, and
   interior members defining at least one fill pattern interposed between the inner skin and outer skin, wherein the at least one fill pattern varies at least one of radially or axially.

10. The body coil support structure of claim 9, wherein the at least one fill pattern comprises a first fill pattern disposed proximal an end portion of the elongate support member and a second fill pattern disposed proximal a central portion along the length of the elongate support member, wherein the first fill pattern is less rigid than the second fill pattern.

11. The body coil support structure of claim 9, wherein the elongate support member comprises a lower portion and an upper portion, wherein the lower portion is configured to support an external load, wherein the at least one fill pattern comprises a first fill pattern disposed in the upper portion and a second fill pattern disposed in the lower portion, wherein the first fill pattern is less rigid than the second fill pattern.

12. The body coil support structure of claim 9, wherein the at least one fill pattern comprises a first fill pattern and a second fill pattern, wherein the first fill pattern is open and the second fill pattern is solid.

13. A method comprising:
   determining, with at least one processor, a target shape for an elongate support member of a body coil support structure;
   determining, with the at least one processor, at least one operational load to be applied to the elongate support member when utilized in a magnetic resonance imaging (MRI) system;
   applying, with the at least one processor, at least one opposite load to the target shape to obtain an opposite-loaded deformation shape for the elongate support member, the at least one opposite load oriented in a direction opposite to the operational load; and
   forming the elongate support member in a design shape corresponding to the opposite-loaded deformation shape.

14. The method of claim 13, wherein the elongate support member comprises an operational axis configured to be oriented perpendicularly to a gravitational field when the elongate support member is utilized in the MRI system, wherein the operational load comprises a gravitational load on the elongate support member.

15. The method of claim 13, further comprising installing the elongate support member in the MRI system and subjecting the elongate support member to the operational load.

16. The method of claim 13, further comprising:
defining a finite element analysis (FEA) target shape mesh corresponding to the target shape;
defining material properties of the target shape mesh corresponding to at least one material of the elongate support member;
deforming the target shape mesh to obtain an opposite-loaded mesh based on the material properties and the operational load; and
determining the design shape using the opposite-loaded mesh.

17. The method of claim 13, wherein the elongate support member comprises an outer skin and an inner skin, and wherein forming the elongate support member comprises forming interior members defining at least one fill pattern interposed between the inner skin and outer skin.

18. The method of claim 17, wherein forming the interior members comprises varying the at least one fill pattern at least one of radially or axially.

19. The method of claim 17, wherein forming the interior members comprises forming a first fill pattern disposed proximal at least one end portion of the elongate support member and a second fill pattern disposed proximal a central portion along the length of the axial support member, wherein the first fill pattern is less rigid than the second fill pattern.

20. The method of claim 17, wherein the elongate support member comprises a lower portion and an upper portion, wherein the lower portion is configured to support an external load, wherein forming the interior members comprises forming a first fill pattern disposed in the upper portion and a second fill pattern disposed in the lower portion, wherein the first fill pattern is less rigid than the second fill pattern.

* * * * *